US012382625B2

United States Patent
Shao et al.

(10) Patent No.: US 12,382,625 B2
(45) Date of Patent: Aug. 5, 2025

(54) SEMICONDUCTOR STRUCTURE AND MANUFACTURING METHOD THEREOF

(71) Applicants: CHANGXIN MEMORY TECHNOLOGIES, INC., Hefei (CN); BEIJING SUPERSTRING ACADEMY OF MEMORY TECHNOLOGY, Beijing (CN)

(72) Inventors: Guangsu Shao, Hefei (CN); Deyuan Xiao, Hefei (CN); Yong Yu, Hefei (CN)

(73) Assignees: CHANGXIN MEMORY TECHNOLOGIES, INC., Hefei (CN); BEIJING SUPERSTRING ACADEMY OF MEMORY TECHNOLOGY, Beijing (CN)

( * ) Notice: Subject to any disclaimer, the term of this patent is extended or adjusted under 35 U.S.C. 154(b) by 479 days.

(21) Appl. No.: 17/933,531

(22) Filed: Sep. 20, 2022

(65) Prior Publication Data

US 2023/0363140 A1 Nov. 9, 2023

Related U.S. Application Data

(63) Continuation of application No. PCT/CN2022/103666, filed on Jul. 4, 2022.

(30) Foreign Application Priority Data

May 9, 2022 (CN) .......................... 202210501456.0

(51) Int. Cl.
*H10B 53/20* (2023.01)
*H10B 12/00* (2023.01)
(Continued)

(52) U.S. Cl.
CPC ........... *H10B 12/30* (2023.02); *H10B 12/482* (2023.02); *H10B 12/488* (2023.02); *H10D 62/402* (2025.01); *H10D 62/80* (2025.01)

(58) Field of Classification Search
CPC .............. H10B 20/40–65; H10B 53/20; H10B 41/20–27; H10B 43/20–27;
(Continued)

(56) References Cited

U.S. PATENT DOCUMENTS 10,535,659 B2  1/2020  Kim et al.
2020/0411686 A1*  12/2020  Haratipour ............. H10D 30/63
(Continued)

FOREIGN PATENT DOCUMENTS

CN  109616474 A  4/2019
CN  113206092 A  8/2021
(Continued)

OTHER PUBLICATIONS

International Search Report cited in PCT/CN2022/103666 mailed Nov. 28, 2022, 8 pages.

*Primary Examiner* — Moin M Rahman
(74) *Attorney, Agent, or Firm* — Kilpatrick Townsend & Stockton LLP

(57) ABSTRACT

The present disclosure relates to the technical field of semiconductors, and provides a semiconductor structure and a manufacturing method thereof. The semiconductor structure includes: a base, and bit lines, word lines, active pillars, and a memory structure that are located on the base. The bit line extends along a first direction, the word line extends along a second direction, the first direction is one of a direction perpendicular to a surface of the base or a direction parallel to the surface of the base, and the second direction is the other of the direction perpendicular to the surface of the base or the direction parallel to the surface of the base. The active pillars are parallel to the base and arranged at intervals, the word line surrounds a channel region of the active pillar, the memory structure surrounds a support region of the active pillar.

6 Claims, 15 Drawing Sheets

(51) Int. Cl.
*H10D 62/40* (2025.01)
*H10D 62/80* (2025.01)

(58) Field of Classification Search
CPC ............ H10B 51/20; H10B 63/84–845; H10B 10/00–18; H10B 12/00–50; H10B 12/05–056; H10B 20/00–10; H10B 20/27–50; H10B 69/00; H10B 12/30; H10B 12/482; H10B 12/488; H10B 12/33; H10B 12/036; H10B 12/485; H10B 12/033; H10B 12/315; H10B 80/00; H10B 12/50; G11C 11/41–419; G11C 11/401–4099; G11C 14/0009–0045; G11C 2211/4016; G11C 17/10–126; G11C 16/02; H10D 88/01; H10D 88/00; H10D 88/101; H10D 84/983–988; H10D 62/402; H10D 62/80; H10D 1/716; H01L 23/5283; H01L 24/08; H01L 24/80; H01L 25/0657; H01L 25/18; H01L 25/50; H01L 2224/08145; H01L 2224/80895; H01L 2224/80896; H01L 2924/1431; H01L 2924/1436

See application file for complete search history.

(56) References Cited

U.S. PATENT DOCUMENTS

| | | | |
|---|---|---|---|
| 2021/0202751 A1* | 7/2021 | Goda | H10D 62/82 |
| 2021/0242210 A1 | 8/2021 | Lee | |
| 2021/0288058 A1* | 9/2021 | Nishimura | H10B 43/10 |
| 2022/0005809 A1 | 1/2022 | Kim et al. | |
| 2022/0013524 A1 | 1/2022 | Ryu et al. | |
| 2022/0130834 A1 | 4/2022 | Lee et al. | |

FOREIGN PATENT DOCUMENTS

| | | |
|---|---|---|
| CN | 113889473 A | 1/2022 |
| CN | 113903741 A | 1/2022 |
| EP | 3826058 A | 5/2021 |

* cited by examiner

SEMICONDUCTOR STRUCTURE AND MANUFACTURING METHOD THEREOF

CROSS-REFERENCE TO RELATED APPLICATIONS

This is a continuation of International Application No. PCT/CN2022/103666, filed on Jul. 4, 2022, which claims the priority to Chinese Patent Application 202210501456.0, titled "SEMICONDUCTOR STRUCTURE AND MANUFACTURING METHOD THEREOF" and filed on May 9, 2022. The entire contents of International Application No. PCT/CN2022/103666 and Chinese Patent Application 202210501456.0 are incorporated herein by reference.

TECHNICAL FIELD

The present disclosure relates to, but is not limited to, a semiconductor structure and a manufacturing method thereof.

BACKGROUND

With the continuous development of integrated circuit process technology, in order to improve the integration of an integrated circuit while enhancing the operating speed of a memory and reducing the power consumption of the memory, the critical dimension of a metal-oxide-semiconductor field-effect transistor (MOSFET) device shrinks continuously, and the MOSFET devices face a series of challenges. For example, in order to reduce the device line width, semiconductor structures evolve from buried word line structures to gate-all-around (GAA) transistor structures. However, the integration of memory devices is mainly determined by the area occupied per memory cell, i.e., the storage capacity is also limited by the size.

How to reduce the device line width and further increase the memory density has become an important problem to be solved by the technical personnel in this field urgently.

SUMMARY

An overview of the subject matter described in detail in the present disclosure is provided below, which is not intended to limit the protection scope of the claims.

The present disclosure provides a semiconductor structure and a manufacturing method thereof.

A first aspect of the present disclosure provides a semiconductor structure, including:
a base, and bit lines, word lines, active pillars, and a memory structure that are located on the base;
wherein the bit line extends along a first direction, the word line extends along a second direction, the first direction is one of a direction perpendicular to a surface of the base or a direction parallel to the surface of the base, and the second direction is the other of the direction perpendicular to the surface of the base or the direction parallel to the surface of the base; and
the active pillars are parallel to the base and arranged at intervals, the word line surrounds a channel region of the active pillar, one of a source region or a drain region of the active pillar is electrically connected to the bit line, the other of the source region or the drain region of the active pillar is electrically connected to the memory structure, the memory structure surrounds a support region of the active pillar, and the support region is located at one end of the source region or the drain region, that is connected to the memory structure, of the active pillar.

A second aspect of the present disclosure provides a method of manufacturing a semiconductor structure, including:
providing a base;
forming a plurality of active pillars that are parallel to the base and arranged at intervals, wherein the active pillars each comprise a source region, a channel region, a drain region, and a support region that are sequentially arranged in a direction parallel to a surface of the base;
forming bit lines extending along a first direction, wherein the first direction is one of a direction perpendicular to a surface of the base or a direction parallel to the surface of the base, and the bit line is electrically connected to one of the source region or the drain region;
forming word lines extending along a second direction, wherein the word lines are located on the base, the second direction is the other of the direction perpendicular to the surface of the base or the direction parallel to the surface of the base, and the word line surrounds the channel region; and
forming a memory structure, wherein the memory structure is connected to the other of the source region or the drain region, the memory structure surrounds the support region, and the support region is located at one end of the source region or the drain region, that is connected to the memory structure, of the active pillar.

Other aspects of the present disclosure are understandable upon reading and understanding of the accompanying drawings and detailed description.

BRIEF DESCRIPTION OF THE DRAWINGS

The accompanying drawings incorporated into the specification and constituting a part of the specification illustrate the embodiments of the present disclosure, and are used together with the description to explain the principles of the embodiments of the present disclosure. In these accompanying drawings, similar reference numerals are used to represent similar elements. The accompanying drawings in the following description are some rather than all of the embodiments of the present disclosure. Those skilled in the art may obtain other accompanying drawings based on these accompanying drawings without creative efforts.

Figure 1:
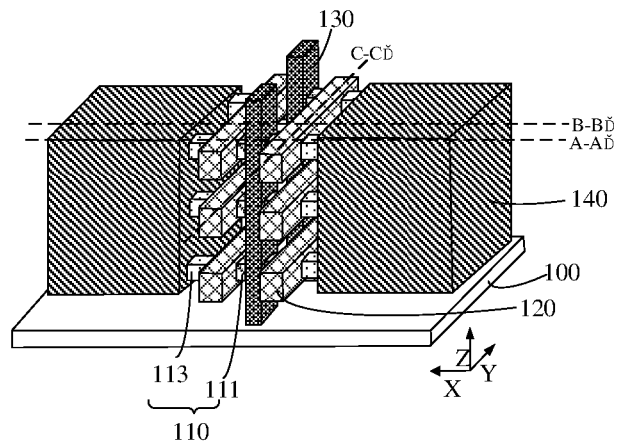
FIG. 1 is a schematic structural diagram of a semiconductor structure according to an embodiment of the present disclosure.

REFERENCE NUMERALS 100. base; 101. first oxide layer; 102. first sacrificial layer; 103. first groove; 104. second sacrificial layer; 105. second groove; 106. active region; 107. fourth groove; 108. insulating layer; 109. first region; 110. active pillar; 111. source region; 112. channel region; 113. drain region; 114. support region; 116. second region; 120. word line; 121. medium layer; 122. isolation layer; 123. dielectric layer; 130. bit line; 140. memory structure;

200. base; 201. first oxide layer; 202. first sacrificial layer; 203. first groove; 204. second sacrificial layer; 205. second groove; 206. active region; 207. isolation groove; 208. insulating layer; 209. third groove; 210. active pillar; 211. source region; 212. channel region; 213. drain region; 214. support region; 216. dielectric layer; 217. second region; 220. word line; 221. medium layer; 222. isolation layer; 230. bit line; 240. memory structure.

DETAILED DESCRIPTION

The technical solutions in the embodiments of the present disclosure are described below clearly and completely with reference to the accompanying drawings in the embodiments of the present disclosure. Apparently, the described embodiments are merely some rather than all of the embodiments of the present disclosure. All other embodiments obtained by those skilled in the art based on the embodiments of the present disclosure without creative efforts should fall within the protection scope of the present disclosure. It should be noted that the embodiments in the present disclosure and features in the embodiments may be combined with each other in a non-conflicting manner.

An embodiment of the present disclosure provides a semiconductor structure, including: a base, and bit lines, word lines, active pillars, and a memory structure that are located on the base. The bit line extends along a first direction. The word line extends along a second direction. The first direction is one of a direction perpendicular to a surface of the base or a direction parallel to the surface of the base, and the second direction is the other of the direction perpendicular to the surface of the base or the direction parallel to the surface of the base. The memory structure surrounds a support region of the active pillar, and the support region is located at an end of a source region or a drain region, that is connected to the memory structure, of the active pillar. That is, the integration of 3D memory devices can be improved by 3D stacking of transistors and capacitors on the substrate, thereby improving the storage density of the semiconductor structure. The support region of the active pillar can be used as a support for the memory structure. The memory structure may be a one-transistor one-capacitor (1T-1C) structure. With a limited device cell area, the area occupied by the memory structure is maximized, which helps improve the storage density.

The embodiments of the present disclosure are described in detail below with reference to the accompanying drawings. Those skilled in the art should understand that many technical details are proposed in the embodiments of the present disclosure to make the present disclosure better understood. However, even without these technical details and various changes and modifications made based on the following embodiments, the technical solutions claimed in the present disclosure may still be realized.

Figure 2:
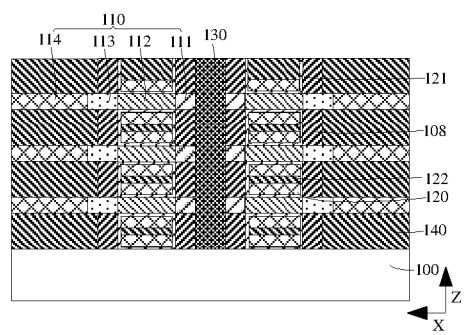
FIG. 2 is a schematic structural cross-sectional diagram of a semiconductor structure along a cross section A-A' according to an embodiment of the present disclosure.
Figure 3:
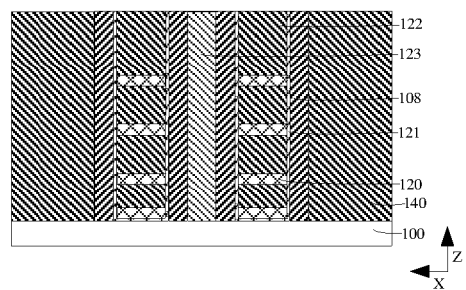
FIG. 3 is a schematic structural cross-sectional diagram of a semiconductor structure along a cross section B-B' according to an embodiment of the present disclosure.
Figure 4:
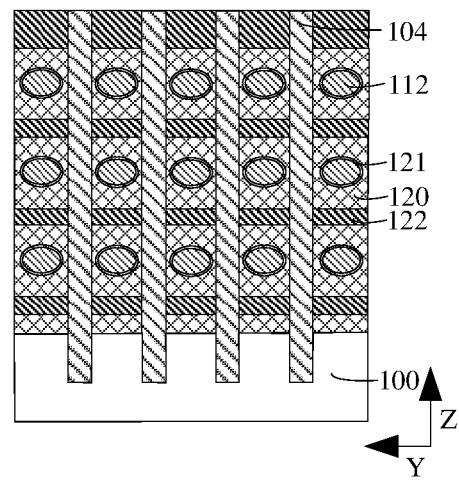
FIG. 4 is a schematic structural cross-sectional diagram of a semiconductor structure along a cross section C-C' according to an embodiment of the present disclosure.

FIG. 1 is a schematic structural diagram of a semiconductor structure according to an embodiment of the present disclosure; FIG. 2 is a schematic structural cross-sectional diagram of a semiconductor structure along a cross section A-A' according to an embodiment of the present disclosure; FIG. 3 is a schematic structural cross-sectional diagram of a semiconductor structure along a cross section B-B' according to an embodiment of the present disclosure; and FIG. 4 is a schematic structural cross-sectional diagram of a semiconductor structure along a cross section C-C' according to an embodiment of the present disclosure.

An aspect of the embodiments of the present disclosure provides a semiconductor structure. Referring to FIG. 1 to FIG. 4, the semiconductor structure includes: a base 100, and bit lines 130, word lines 120, active pillars 110, and a memory structure 140 that are located on the base 100. The bit line 130 extends along the first direction. The word line 120 extends along the second direction. The first direction is direction Z perpendicular to a surface of the base 100, and the second direction is direction Y parallel to the surface of the base 100. The active pillars 110 are parallel to the base 100 and arranged at intervals. The word line 120 surrounds a channel region 112 of the active pillar 110, a source region 111 of the active pillar 110 is electrically connected to the bit line 130, and a drain region 113 of the active pillar 110 is electrically connected to the memory structure 140. The memory structure 140 surrounds a support region 114 of the active pillar 110. The support region 114 is located at an end of the drain region 113 of the active pillar 110 that is connected to the memory structure 140.

In some embodiments, a material of the base 100 may be a semiconductor. The semiconductor material specifically may be any one of silicon, germanium, silicon germanide, or silicon carbide.

In some embodiments, referring to FIG. 1 to FIG. 4, the active pillar 110 extends along third direction X. The third direction X is parallel to the surface of the base 100, and the third direction X is perpendicular to direction Y. The active pillar 110 includes a source region 111, a channel region 112, a drain region 113, and a support region 114. The word line 120 surrounds the channel region 112 of the active pillar 110. Along the third direction X, the source region 111 and the drain region 113 are located at two ends of the channel region 112 respectively. The source region 111 is connected to the bit line 130, and the drain region 113 is connected to the memory structure 140. The memory structure 140 surrounds the support region 114.

In some embodiments, a material of the active pillar 110 includes an amorphous material. The amorphous material has internal gaps and high carrier mobility, which can reduce the thickness of the active pillar 110 and reduce the line width of the semiconductor structure within the limited cell area, thereby further increasing the storage density of the semiconductor structure. The amorphous material includes at least one of indium gallium zinc oxide (IGZO), indium tin oxide (ITO), indium gallium zinc tin oxide (IGZTO), or indium tungsten oxide (IWO). In other embodiments, the material of the active pillar 110 may be doped polysilicon, undoped polysilicon or amorphous silicon. A dopant element may be an N-type element or a P-type element. The N-type element may be a group V element such as phosphorus (P), bismuth (Bi), antimony (Sb) or arsenic (As), and the P-type element may be a group III element such as boron (B), aluminum (Al), gallium (Ga) or indium (In).

In some embodiments, referring to FIG. 1 to FIG. 4, the bit line 130 may extend along direction Z perpendicular to the surface of the base 100. The bit line 130 may be a metal bit line, and a material of the bit line 130 may be tungsten, copper, molybdenum, silver, or other metal. The metal has low resistance, which helps improve the conductivity of the bit line 130 and the active pillar 110. In other embodiments, the bit line 130 may be a semiconductor bit line, and a material of the semiconductor bit line may be silicon, germanium, silicon germanide, silicon carbide or polysilicon. Moreover, the semiconductor bit line is doped with an element of the same type as the element doped in the active pillar 110. The dopant element may be used as carriers, to facilitate migration and diffusion of carriers between the bit line 130 and the active pillar 110, thereby helping improve the conductivity of the bit line 130 and the active pillar 110.

In some embodiments, referring FIG. 1 to FIG. 4, the word line 120, the channel region 112, and the source region 111 and the drain region 113 that are located at two ends of the channel region 112 form a transistor structure. Along a direction from the source region 111 to the drain region 113, at least two transistor structures are provided. Two transistor structures are electrically connected to the same bit line 130, such that the two transistor structures share the bit line 130. In addition, along direction X parallel to the base 100, the memory structure 140 located at two sides of the bit line 130 is formed. In this way, the embodiments of the present disclosure can implement 3D stacking, and reduce the size of the critical device by sharing the bit line 130, thereby improving the performance of the semiconductor device and the stability of the semiconductor structure.

In some embodiments, referring to FIG. 1 to FIG. 4, the word line 120 is used as a gate of the semiconductor structure, and the word line 120 surrounds the channel region 112 of the active pillar 110, that is, the semiconductor structure is a gate-all-around (GAA) structure. In the GAA structure, the gate can surround the channel region 112 of the semiconductor on all sides, which can desirably solve the problems such as leakage current, capacitance effect, and short channel effect due to reduced spacing between gates, and reduce the area occupied by the word line 120 in the vertical direction, thereby helping improve the gate control performance and the integration of the semiconductor structure.

In some embodiments, referring to FIG. 1 to FIG. 4, a material of the word line 120 is any one of tungsten, tantalum, molybdenum, titanium nitride or tantalum nitride, to form a metal gate line. In other embodiments, the material of the word line 120 is doped polysilicon. The polysilicon has a similar energy gap with the material of the active pillar 110 that serves as a channel, and a work function of the polysilicon can be changed by controlling a doping concentration, which helps reduce a threshold voltage between the gate and the channel region 112. A dopant element type of the doped polysilicon is the same as or different from a dopant element type of the channel region 112 of the active pillar 110.

In some embodiments, referring to FIG. 1 to FIG. 4, the memory structure 140 may be capacitor structures, and the support region 114 of the active pillar 110 may be used as a support pillar of the capacitor structures. The semiconductor structure may form a 1T-1C structure. A first medium layer (not show in the figure) is provided between adjacent capacitor structures, and a material of the first medium layer may include any one or more of silicon oxide, silicon nitride, or a high-K material. The high-K material may include hafnium oxide, zirconium oxide, aluminum oxide, lanthanum oxide, titanium oxide, tantalum oxide, niobium oxide or strontium titanate.

In some embodiments, referring to FIG. 1 to FIG. 4, the semiconductor structure further includes: an insulating layer 108 and a dielectric layer 123. The insulating layer 108 is located between the word line 120 and the bit line 130, and the insulating layer 108 is further located between the word line 120 and the memory structure 140, to achieve an insulation and isolation effect. The dielectric layer 123 is located between adjacent bit lines 130. A material of the insulating layer 108 may be silicon nitride, silicon oxide, or other high-K materials. A material of the dielectric layer 123 may be silicon oxide, silicon carbide, or silicon nitride.

In some embodiments, referring to FIG. 1 to FIG. 4, the semiconductor structure further includes a medium layer 121. The medium layer 121 is located between the word line 120 and the insulating layer 108, and between the word line 120 and the channel region 112 of the active pillar 110. The medium layer 121 may be used as a gate dielectric layer. A material of the medium layer 121 may be silicon oxide, silicon carbide, silicon nitride or other high-K materials, to suppress the short channel effect, thereby suppressing the tunneling leakage current and the like.

Referring to FIG. 1 to FIG. 4, the semiconductor structure further includes an isolation layer 122 and a second sacrificial layer 104. The isolation layer 122 is located between adjacent active pillars 110. Specifically, the isolation layer 122 is located between adjacent word lines 120 along direction Z perpendicular to the surface of the base 100; and the second sacrificial layer 104 is located between adjacent word lines 120 along direction Y parallel to the surface of the base 100.

In some embodiments, referring to FIG. 1 to FIG. 4, the isolation layer 122 and the second sacrificial layer 104 are configured to isolate adjacent word lines 120, to avoid short circuit caused by electrical connection between the adjacent word lines 120. A material of the isolation layer 122 may be silicon oxide, and a material of the second sacrificial layer 104 may include an oxide or polysilicon, and the oxide may include silicon oxide, aluminum oxide or titanium oxide.

The foregoing embodiment is described using an example in which the first direction is direction Z perpendicular to the surface of the base, and the second direction is direction Y parallel to the surface of the base. Another embodiment of the present disclosure further provides a semiconductor structure. The semiconductor structure provided by another embodiment of the present disclosure is substantially the same as the semiconductor structure provided by the foregoing embodiment, except that the first direction is direction Y parallel to the surface of the base, and the second direction is direction Z perpendicular to the surface of the base. That is, the bit line extends along the direction parallel to the surface of the base, and the word line extends along the direction perpendicular to the surface of the base.

Figure 5:
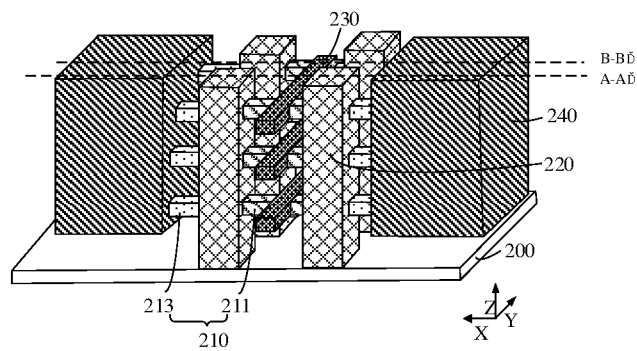
FIG. 5 is a schematic structural diagram of a semiconductor structure according to another embodiment of the present disclosure.
Figure 6:
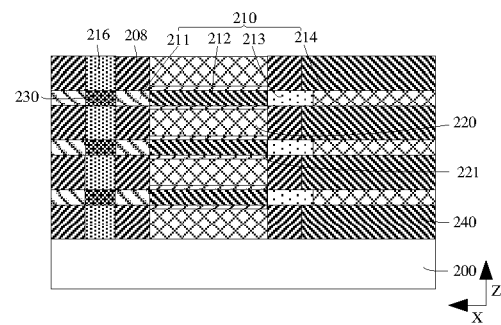
FIG. 6 is a schematic structural cross-sectional diagram of a semiconductor structure along a cross section A-A' according to another embodiment of the present disclosure.

FIG. 5 is a schematic structural diagram of a semiconductor structure according to another embodiment of the present disclosure; and FIG. 6 is a schematic structural cross-sectional diagram of a semiconductor structure along a cross section A-A' according to another embodiment of the present disclosure. The semiconductor structure provided by another embodiment of the present disclosure is described in detail below with reference to FIG. 5 and FIG. 6. The parts the same as or corresponding to those mentioned in the foregoing embodiment will not be described in detail again in the following.

Referring to FIG. 5 to FIG. 6, the semiconductor structure includes: a base 200, and bit lines 230, word lines 220, active pillars 210, and a memory structure 240 that are located on the base 200. The bit line 230 extends along the first direction. The word line 220 extends along the second direction. The first direction is direction Y parallel to the surface of the base 200, and the second direction is direction Z perpendicular to the surface of the base 200. The active pillars 210 are parallel to the base 200 and arranged at intervals. The word line 220 surrounds a channel region 212 of the active pillar 210, a source region 211 of the active pillar 210 is electrically connected to the bit line 230, and a drain region 213 of the active pillar 210 is electrically connected to the memory structure 240. The memory structure 240 surrounds a support region 214 of the active pillar 210. The support region 214 is located at an end of the drain region 213 of the active pillar 210 that is connected to the memory structure 240.

In some embodiments, referring to FIG. 5 and FIG. 6, the active pillar 210 extends along a third direction X. The active pillar 210 includes a source region 211, a channel region 212, a drain region 213, and a support region 214. The word line 220, the channel region 212, and the source region 211 and drain region 213 located at two sides of the channel region 212 constitute a transistor structure; along a direction from the source region 211 to the drain region 213, at least two transistor structures are provided. Two transistor structures are electrically connected to the same bit line 230.

Referring to FIG. 5 and FIG. 6, the semiconductor structure further includes an insulating layer 208 and a dielectric layer 216. The insulating layer 208 is located between the word line 220 and the bit line 230, and the insulating layer 208 is further located between the word line 220 and the memory structure 240. The dielectric layer 216 is located between adjacent bit lines 230, and between adjacent parts of the insulating layer 208. The semiconductor structure further includes a medium layer 221. The medium layer 221 is located between the word line 220 and the insulating layer 208, and between the word line 220 and the channel region 212 of the active pillar 210.

In the technical solution provided by this embodiment of the present disclosure, as shown in FIG. 1 to FIG. 4, the semiconductor structure includes: a base 100, and bit lines 130, word lines 120, active pillars 110, and a memory structure 140 that are located on the base 100. The bit line 130 extends along direction Z perpendicular to the surface of the base 100, and the word line 120 extends along direction Y parallel to the surface of the base 100 (or as shown in FIG. 5 to FIG. 6, the bit line 230 extends along direction Y parallel to the surface of the base 200, and the word line 220 extends along direction Z perpendicular to the surface of the base 200). The memory structure 140 surrounds the support region 114 of the active pillar 110, and the support region 114 is located at an end of the drain region 113, that is connected to the memory structure 140, of the active pillar 110. That is, the integration of 3D memory devices can be improved by 3D stacking of transistors and capacitors on the base 100, thereby improving the storage density of the semiconductor structure. The support region 114 of the active pillar 110 can be used as a support for the memory structure 140. With a limited device cell area, the area occupied by the memory structure is maximized, which helps improve the storage density.

Correspondingly, an embodiment of the present disclosure provides a method of manufacturing a semiconductor structure, which may be used to manufacture the semiconductor structure as shown in FIG. 1 to FIG. 4. Contents same as or corresponding to those in the above embodiment will not be described again.

FIG. 7 to FIG. 30 are schematic structural diagrams corresponding to a method of manufacturing a semiconductor structure according to an embodiment of the present disclosure. FIG. 7 to FIG. 20 are schematic structural cross-sectional diagrams corresponding to a method of manufacturing a semiconductor structure along a cross section A-A' according to an embodiment of the present disclosure. FIG. 21 to FIG. 30 are schematic structural cross-sectional diagrams corresponding to a method of manufacturing a semiconductor structure along a cross section C-C' according to an embodiment of the present disclosure. The method of manufacturing a semiconductor structure provided by this embodiment is described in detail below with reference to the accompanying drawings.

Referring to FIG. 7 to FIG. 16 and FIG. 21 to FIG. 30, a base 100 is provided; a plurality of active pillars 110 that are parallel to the base 100 and arranged at intervals are formed, wherein the active pillars 110 each include a source region 111, a channel region 112, a drain region 113, and a support region 114 that are sequentially arranged along direction X parallel to a surface of the base 100; word lines 120 extending along a second direction are formed, wherein the word lines 120 are located on the base 100. The second direction is direction Y parallel to the surface of the base 100, and the word line 120 surrounds the channel region 112.

Figure 7:
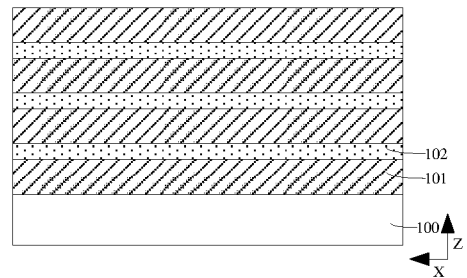
FIG. 7 to FIG. 30 are schematic structural diagrams corresponding to a method of manufacturing a semiconductor structure according to an embodiment of the present disclosure.
Figure 21:
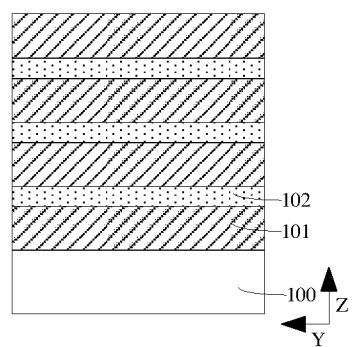

Specifically, referring to FIG. 7 or FIG. 21, an initial base is provided, and first sacrificial layers 102 and first oxide layers 101 that are arranged alternately are sequentially formed on a surface of the initial base.

In some embodiments, a material of the first sacrificial layer 102 and a material of the first oxide layer 101 have different etch selectivities. A material of the first sacrificial layer 102 includes silicon nitride, titanium nitride, aluminum nitride, gallium nitride or indium nitride; and a material of the first oxide layer 101 is silicon oxide. The initial base can be regarded as the base 100.

Figure 22:
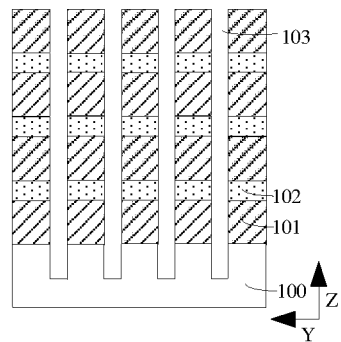

Referring to FIG. 22, the first sacrificial layers 102 and the first oxide layers 101 are patterned, to form a first groove 103, wherein a bottom of the first groove 103 exposes the initial base. The first groove 103 may be used as an isolation region between adjacent transistors along direction Y parallel to the surface of the base 100.

In this embodiment, referring to FIG. 22, the first sacrificial layers 102, the first oxide layers 101, and the initial base in the thickness direction are etched along the cross section B-B' (referring to FIG. 1) to form the first groove 103.

Figure 23:
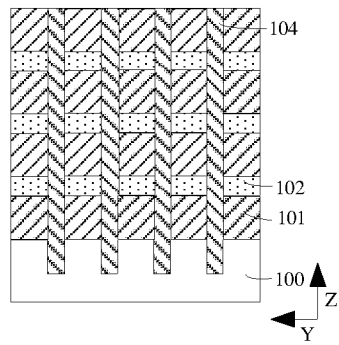

Referring to FIG. 23, a second sacrificial layer 104 is formed, wherein the second sacrificial layer 104 fills up the first groove 103 (referring to FIG. 22). A material of the second sacrificial layer 104 includes an oxide or polysilicon, and the oxide may include silicon oxide, aluminum oxide or titanium oxide.

Figure 8:
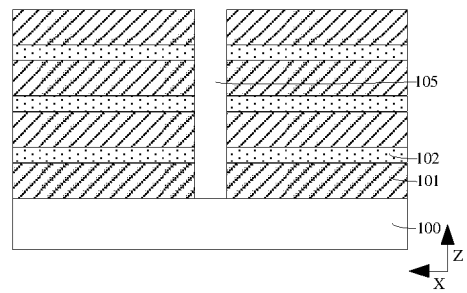

Referring to FIG. 8, a part of the first sacrificial layers 102, a part of the first oxide layers 101, and a part of the second sacrificial layer 104 (referring to FIG. 23) are etched, to form a second groove 105 exposing the base 100. An extension direction of the second groove 105 intersects with an extension direction of the first groove 103, and both the extension direction of the second groove 105 and the extension direction of the first groove 103 are parallel to the surface of the base 100.

Referring to FIG. 8, the extension direction of the second groove 105 is direction Y parallel to the surface of the base 100, and the extension direction of the first groove 103 is the third direction X. Moreover, the extension direction of the second groove 105 is perpendicular to the extension direction of the first groove 103 (referring to FIG. 22).

Figure 9:
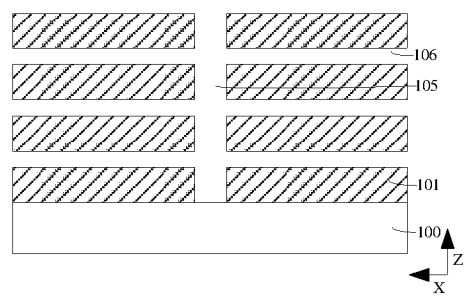
Figure 24:
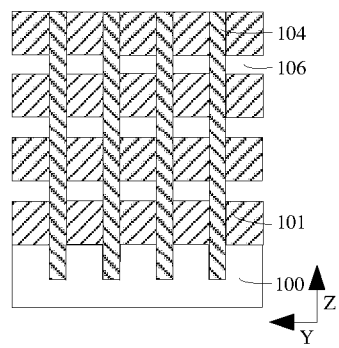

Referring to FIG. 9 or FIG. 24, the first sacrificial layers 102 are removed through the second groove 105, to form active regions 106 arranged at intervals between the first oxide layers 101. The active regions 106 are used as regions for the subsequently formed active pillars 110 (referring to FIG. 10 or FIG. 25).

In some embodiments, the first sacrificial layers 102 may be removed through a wet etching process. An etching solution of the wet etching process is a phosphoric acid solution. Specifically, the phosphoric acid has a concentration of 20-98%, a reaction time of 1-3600 s, and a reaction temperature of 25-200° C.

Figure 10:
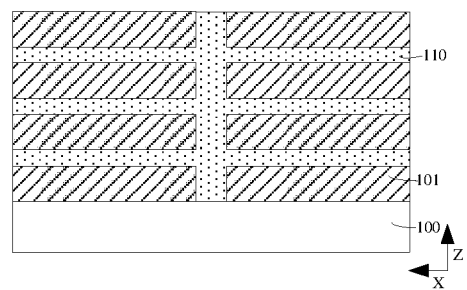
Figure 25:
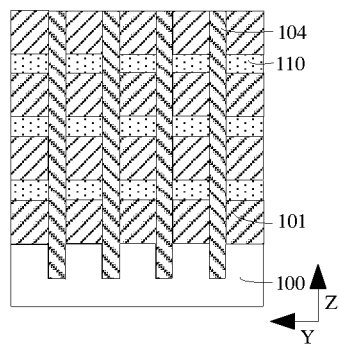

Referring to FIG. 10 or FIG. 25, an amorphous material is deposited. The amorphous material fills up the active regions 106 (referring to FIG. 9) and the second groove 105 (referring to FIG. 9), to form a plurality of active pillars 110 that are parallel to the surface of the base 100 and arranged at intervals.

In some embodiments, the amorphous material includes at least one of indium gallium zinc oxide (IGZO), indium tin oxide (ITO), indium gallium zinc tin oxide (IGZTO), or indium tungsten oxide (IWO).

Figure 11:
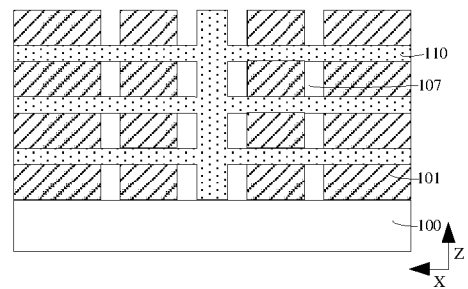

Referring to FIG. 11, a part of the first oxide layers 101 and a part of the second sacrificial layer 104 (referring to FIG. 22) between adjacent active pillars 110 are removed through etching, to form a fourth groove 107. An extension direction of the fourth groove 107 is the same as the extension direction of the second groove 105 (referring to FIG. 9), and a side surface of the fourth groove 107 exposes a side surface of the active pillar 110 located in the second groove 105 (referring to FIG. 9).

In some embodiments, a part of the second sacrificial layer 104 (referring to FIG. 22) located between adjacent active pillars 110 is removed first, to expose side surfaces of the first oxide layers 101, and then a part of the first oxide layers 101 located between adjacent active pillars 110 is removed. Specifically, a part of the second sacrificial layer 104 (referring to FIG. 22) and a part of the first oxide layers 101 may be removed through a dry etching process or a wet etching process.

Figure 12:
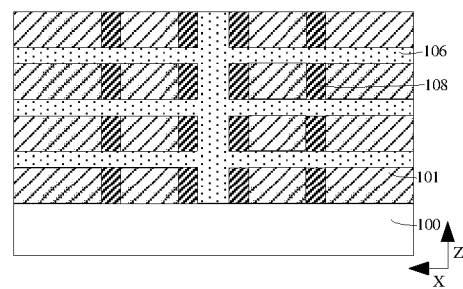

Referring to FIG. 12, an insulating layer 108 is formed. The insulating layer 108 fills up the fourth groove 107 (referring to FIG. 11), and is located between adjacent active pillars 110.

Figure 13:
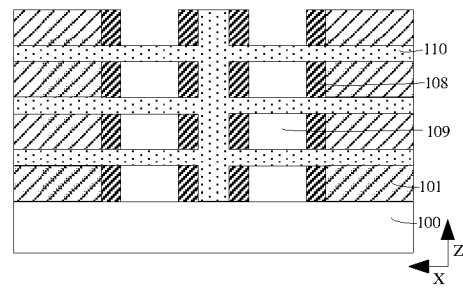
Figure 26:
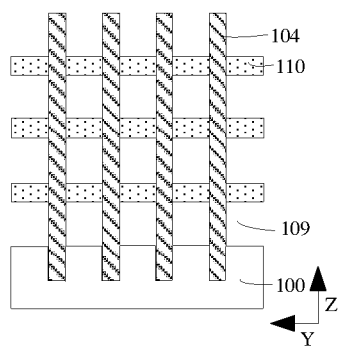

Referring to FIG. 13 or FIG. 26, a part of the first oxide layers 101 and a part of the second sacrificial layer 104 located between adjacent active pillars 110 are removed through etching; a part of the first oxide layers 101 and a part of the second sacrificial layer 104 located between adjacent parts of the insulating layer 108 are removed through etching to form the first region 109.

Specifically, a part of the second sacrificial layer 104 located between adjacent active pillars 110 and a part of the insulating layer 108 located between adjacent parts of the fifth groove (not marked in the figure) are first removed through etching; then a part of the first oxide layers 101 located between adjacent active pillars 110 and between adjacent parts of the insulating layer 108 is removed through etching along the fifth groove to form a sixth groove (not marked in the figure); the fifth groove and the sixth groove jointly form the first region 109.

Figure 27:
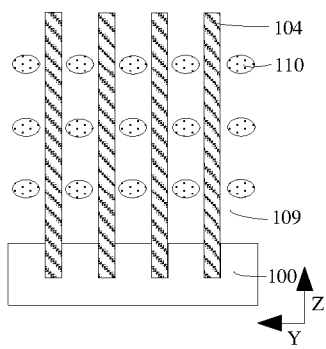

Referring to FIG. 27, the active pillar 110 exposed to the first region 109 is smoothed, such that the shape of the active pillar 110 along the C-C' profile is elliptical or nearly elliptical, which can reduce the surface damage of the active pillar 110 and the surface defects of the active pillar 110, thereby helping reduce the impedance between the active pillar 110 and the subsequently formed word line 120 (referring to FIG. 15 or FIG. 29). In other embodiments, the active pillar 110 may not be smoothed.

Figure 14:
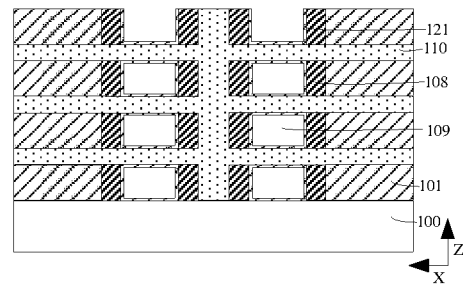
Figure 28:
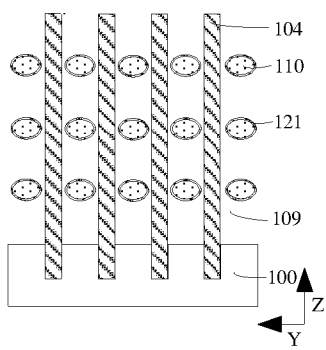

Referring to FIG. 14 and FIG. 28, a medium layer 121 is formed, wherein the medium layer 121 surrounds the active pillar 110, and the medium layer 121 is further located on a side surface of the insulating layer 108 exposed to the first region 109.

Figure 15:
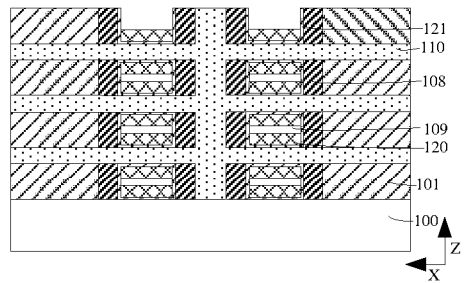
Figure 29:
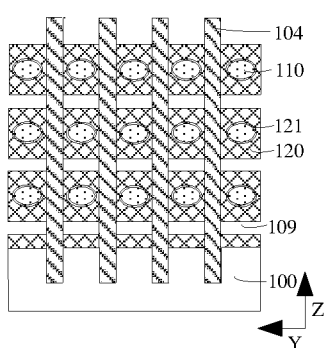

Referring to FIG. 15 and FIG. 29, a conductive layer (not show in the figure) is formed. The conductive layer surrounds the medium layer 121. A part of the conductive layer is removed through back etching along direction Y parallel to the surface of the base 100, and the remaining part of the conductive layer forms a plurality of word lines 120 arranged at intervals.

Figure 16:
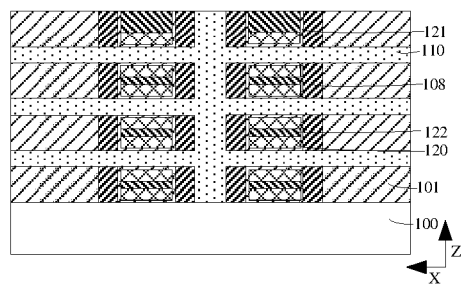
Figure 30:
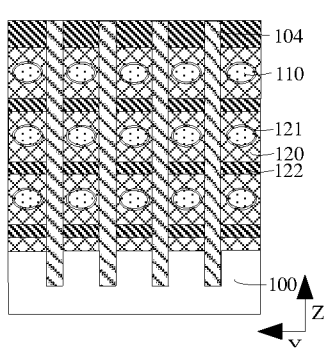

Referring to FIG. 16 and FIG. 30, in direction Z perpendicular to the surface of the base 100, an isolation layer 122 is formed between the word lines 120. In some embodiments, in an extension direction of the word line 120, a distance between adjacent active pillars 110 is less than the thickness of the first oxide layer 101, and the word line 120 surrounds the channel regions 112 of a plurality of active pillars 110.

Figure 17:
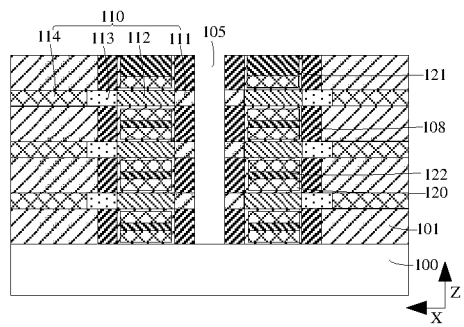
Figure 18:
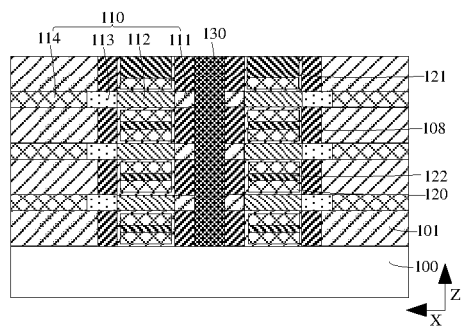

Referring to FIG. 17 to FIG. 18, bit lines 130 extending along a first direction are formed, wherein the first direction is direction Z perpendicular to the surface of the base 100, and the bit line 130 are electrically connected to the source region 111. In other embodiments, the bit line 130 is electrically connected to the drain region 113. Specifically, in the forming the bit lines 130, referring to FIG. 17, a part of the amorphous material filled in the second groove 105 (referring to FIG. 9) is removed. Referring to FIG. 18, a conductive material is deposited in the second groove 105, and a part of the conductive material is removed through etching, to form, in the second groove 105, the bit lines 130 perpendicular to the surface of the base 100. At the same time, a dielectric layer 123 is formed in the remaining part of the second groove 105, wherein the dielectric layer 123 is located between adjacent bit lines 130.

In some embodiments, the conductive material may be metal such as tungsten, copper, molybdenum, or silver, or may be polysilicon.

Figure 19:
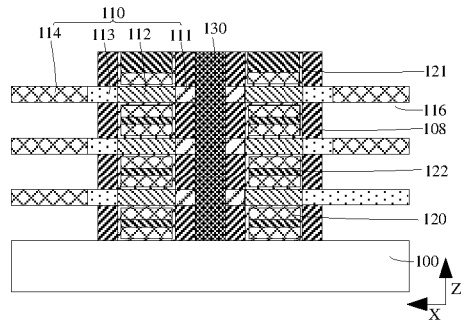
Figure 20:
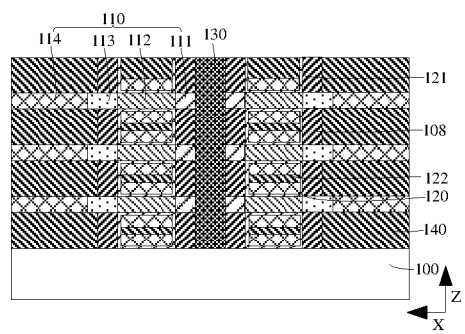

Referring to FIG. 19 and FIG. 20, a memory structure 140 is formed. The memory structure 140 is electrically connected to the drain region 113. The memory structure 140 surrounds the support region 114 of the active pillar 110. The support region 114 is located at an end of the drain region 113, that is connected to the memory structure 140, of the active pillar 110.

In some embodiments, the memory structure 140 is capacitor structures. In other embodiments, the memory structure 140 is electrically connected to the source region 111 of the active pillar 110. The support region 114 is located at an end of the source region 111, that is connected to the memory structure 140, of the active pillar 110. The memory structure 140 may include a plurality of capacitor structures. The capacitor structures correspond to the active pillars 110 in a one-to-one manner, that is, a memory cell may be a memory cell of a 3D DRAM having a 1T-1C structure. A first medium layer (not show in the figure) is provided between adjacent capacitor structures.

Specifically, in the forming the memory structure 140, referring to FIG. 19, the remaining part of the first oxide layers 101 (referring to FIG. 18) is removed through etching, to form a second region 116, wherein the second region 116 exposes partial surface of the drain region 113 and the support region 114.

Referring to FIG. 20, the memory structure 140 is formed in the second region 116.

Correspondingly, another embodiment of the present disclosure further provides a method of manufacturing a semiconductor structure, which may be used to manufacture the semiconductor structure as shown in FIG. 5 to FIG. 6.

FIG. 31 to FIG. 58 are schematic structural diagrams corresponding to a method of manufacturing a semiconductor structure according to an embodiment of the present disclosure. FIG. 31 to FIG. 58 merely show a manufacturing method for forming a column of transistors. FIG. 31 to FIG. 43 are schematic structural cross-sectional diagrams corresponding to a method of manufacturing a semiconductor structure along a cross section A-A' according to an embodiment of the present disclosure. FIG. 44 to FIG. 58 are top views corresponding to a method of manufacturing a semiconductor structure according to an embodiment of the present disclosure. The method of manufacturing a semiconductor structure provided by this embodiment is described in detail below with reference to the accompanying drawings. The semiconductor structure provided by another embodiment of the present disclosure is described in detail below with reference to FIG. 31 to FIG. 58. The parts the same as or corresponding to those mentioned in the foregoing embodiment will not be described in detail again in the following.

Referring to FIG. 31 to FIG. 34 and FIG. 44 to FIG. 48, a base 200 is provided; a plurality of active pillars 210 that are parallel to the base 200 and arranged at intervals are formed, wherein the active pillars 210 each include a source region 211, a channel region 212, a drain region 213, and a support region 214 that are sequentially arranged along direction X parallel to a surface of the base 200; word lines 220 extending along a second direction are formed, wherein the word lines 220 are located on the base 200. The second direction is direction Y parallel to the surface of the base, and the word line 220 surrounds the channel region 212 of the active pillar 210.

Figure 31:
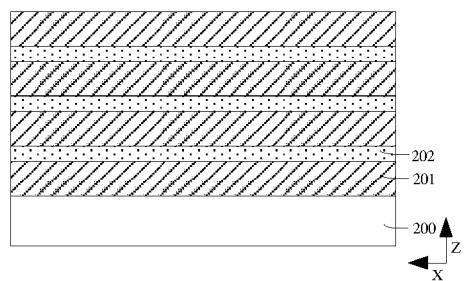
FIG. 31 to FIG. 58 are schematic structural diagrams corresponding to a method of manufacturing a semiconductor structure according to another embodiment of the present disclosure.
Figure 44:
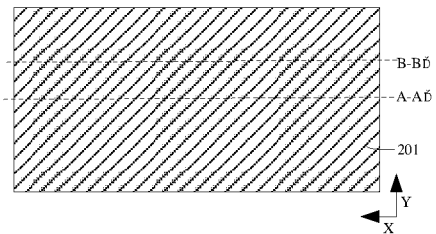

Referring to FIG. 31 and FIG. 44, an initial base is provided, and first sacrificial layers 202 and first oxide layers 201 that are arranged alternately are sequentially formed on a surface of the initial base. The initial base can be regarded as the base 200.

Figure 45:

Referring to FIG. 45, the first sacrificial layers 202 and the first oxide layers 201 are patterned, to form a first groove 203, wherein a bottom of the first groove 203 exposes the base 200.

Figure 46:
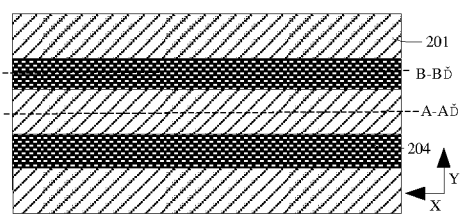

Referring to FIG. 46, a second sacrificial layer 204 is formed, wherein the second sacrificial layer 204 fills up the first groove 203 (referring to FIG. 45).

Figure 32:
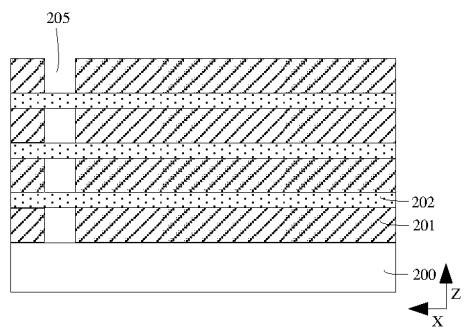
Figure 47:
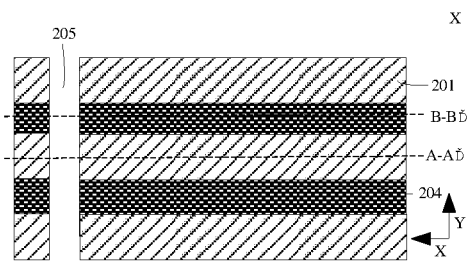

Referring to FIG. 32 or FIG. 47, a part of the first sacrificial layers 202, a part of the first oxide layers 201, and a part of the second sacrificial layer 204 are etched, to form a second groove 205 exposing the base 200. An extension direction of the second groove 205 intersects with an extension direction of the first groove 203, and both the extension direction of the second groove 205 and the extension direction of the first groove 203 are parallel to the surface of the base 200.

Figure 33:
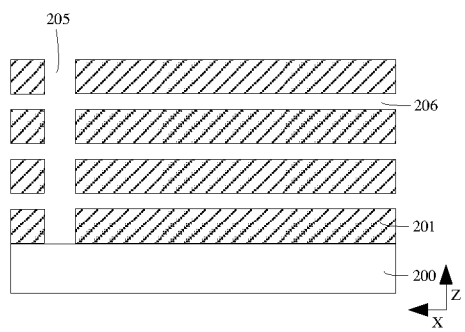

Referring to FIG. 33 or FIG. 47, the first sacrificial layers 202 are removed through the second groove 205, to form active regions 206 arranged at intervals between the first oxide layers 201.

Figure 34:
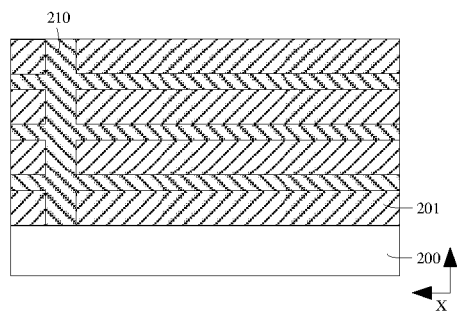
Figure 48:
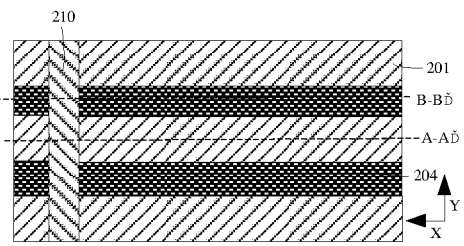

Referring to FIG. 34 or FIG. 48, an amorphous material is deposited. The amorphous material fills up the active regions 206 (referring to FIG. 32) and the second groove 205 (referring to FIG. 32), to form a plurality of active pillars 210 that are parallel to the surface of the base 200 and arranged at intervals.

Figure 35:
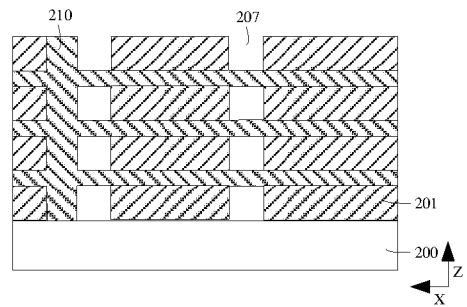
Figure 49:
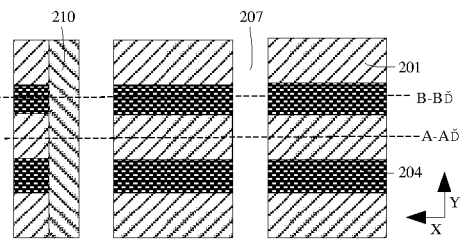

Referring to FIG. 35 or FIG. 49, a part of the first oxide layers 201 and a part of the second sacrificial layer 204 are removed, to form two isolation grooves 207. The two isolation grooves 207 expose the source region 211 and the drain region 213 of the active pillar 210 respectively. An extension direction of the isolation groove 207 is the same as the extension direction of the second groove 205 (referring to FIG. 32), and a side surface of the isolation groove 207 exposes a side surface of the active pillar 210 located in the second groove 205 (referring to FIG. 32).

Figure 36:
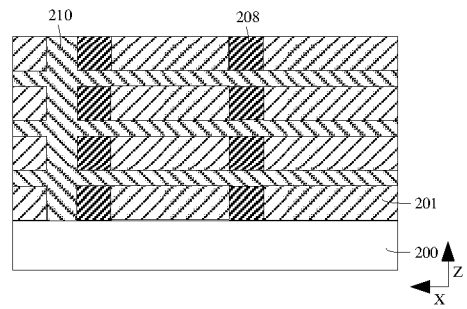
Figure 50:
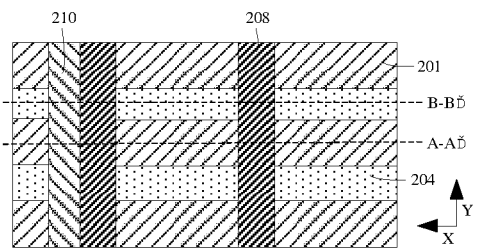

Referring to FIG. 36 or FIG. 50, an insulating layer 208 is formed in the two isolation grooves 207 (referring to FIG. 35). The insulating layer 208 is located between adjacent active pillars 210.

Figure 37:
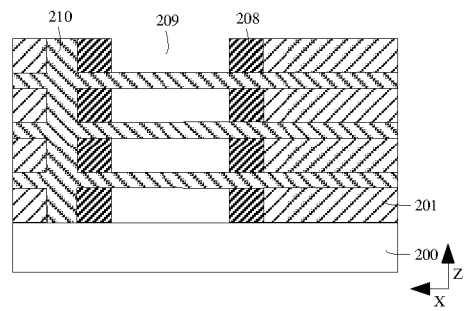

Referring to FIG. 37, a part of the first oxide layers 201 and a part of the second sacrificial layer 204 located between adjacent active pillars 210 are removed through etching; a part of the first oxide layers 201 and a part of the second sacrificial layer 204 located between adjacent parts of the insulating layer 208 are removed to form a third groove 209, wherein the channel region 212 is exposed in the third groove 209. In some embodiments, the third groove 209 is located between the two isolation grooves 207 (referring to FIG. 35).

Figure 51:
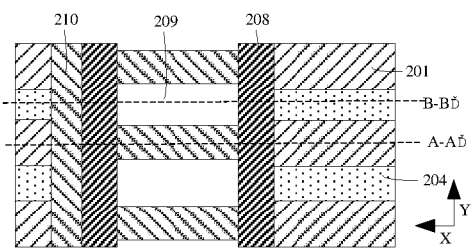

Referring to FIG. 51, the active pillar 210 exposed in the third groove 209 is smoothed, such that a cross section of the active pillar 210 in direction Y parallel to the surface of the base 200 is elliptical or nearly elliptical.

Figure 38:
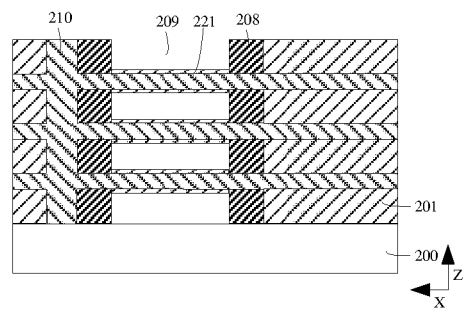
Figure 52:
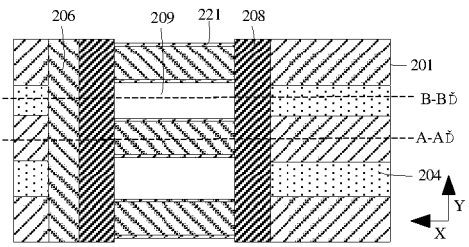

Referring to FIG. 38 and FIG. 52, a medium layer 221 is formed on the exposed surface of the active pillar 210.

Figure 39:
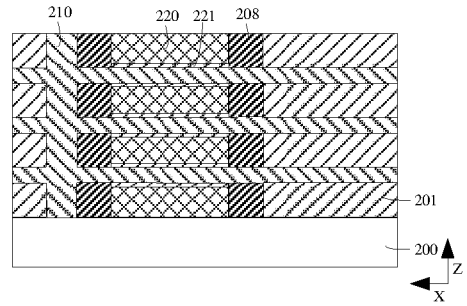
Figure 40:
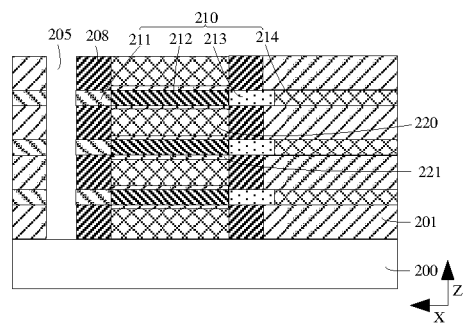
Figure 53:
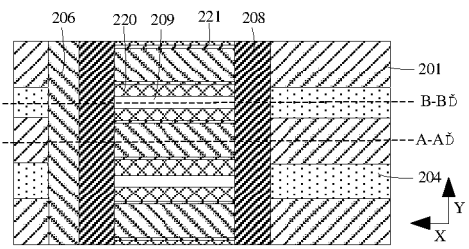

Referring to FIG. 39 and FIG. 53, a conductive layer is formed on a surface of the medium layer 221, and the conductive layer fills up the third groove 209 (referring to FIG. 37). The conductive layer is etched back along direction Z perpendicular to the surface of the base 200, and the remaining part of the conductive layer forms a plurality of word lines 220 arranged at intervals.

Figure 54:
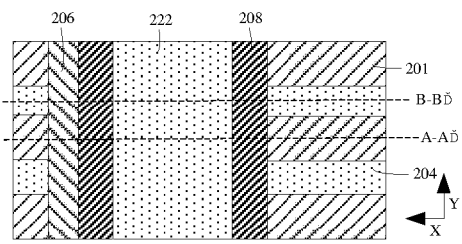
Figure 55:
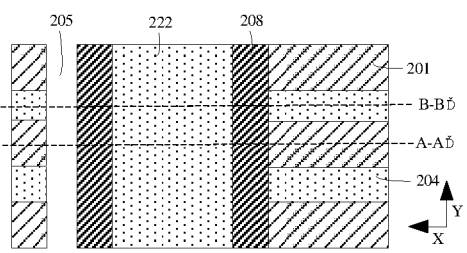

Referring to FIG. 54, in direction Y parallel to the surface of the base 200, an isolation layer 222 is formed between the word lines 220. The isolation layer 222 is further located on the surfaces of the word lines 220

Referring to FIG. 40 to FIG. 41 and FIG. 55 to FIG. 56, bit lines 230 extending along a first direction are formed, wherein the first direction is direction Y parallel to the surface of the base 200, and the bit line 230 is electrically connected to the source region 211. In other embodiments, the bit line 230 is electrically connected to the drain region 213. Specifically, in the forming the bit lines 230, referring to FIG. 40 and FIG. 55, a part of the amorphous material filled in the second groove 205 (referring to FIG. 32) is removed, to expose the region of the second groove 205, to subsequently form the bit lines 230 (referring to FIG. 41 and FIG. 56).

Figure 41:
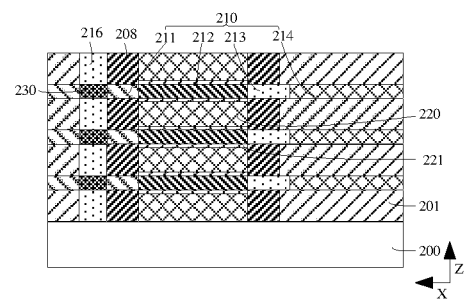
Figure 56:
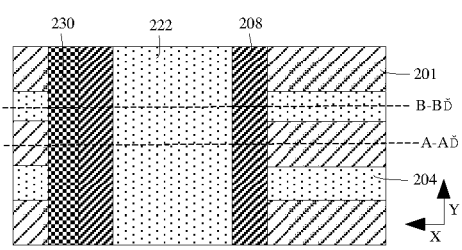
Figure 57:
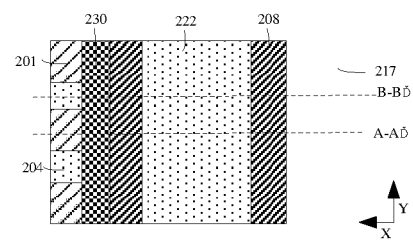

Referring to FIG. 41 and FIG. 56, an oxide material and a conductive material are deposited in the second groove 205 (referring to FIG. 40) and etched repeatedly, to form, in the second groove 205, the bit lines 230 and a dielectric layer 216 that are arranged at intervals and extend along the surface of the base 200.

In some embodiments, the oxide material is used to form the dielectric layer 216, wherein the oxide material may be silicon oxide, aluminum oxide or titanium oxide. The conductive material is used to form the bit lines 230, wherein the conductive material is metal such as tungsten, copper, or silver or may be polysilicon.

Referring to FIG. 42 to FIG. 43 and FIG. 57 to FIG. 58, a memory structure 240 is formed. The memory structure 240 is electrically connected to the drain region 213. The memory structure 240 surrounds the support region 214 of the active pillar 210, and the support region 214 is located at an end of the drain region 213, that is connected to the memory structure 240, of the active pillar 210. The memory structure 240 is capacitor structures. In other embodiments, the memory structure 240 is electrically connected to the source region 211 of the active pillar 210. Specifically, in the forming the memory structure 240, referring to FIG. 42 and FIG. 57, the remaining part of the first oxide layers 201 (referring to FIG. 41) is removed through etching, to form a second region 217, wherein the second region 217 exposes partial surface of the drain region 213 and the support region 214.

Figure 42:
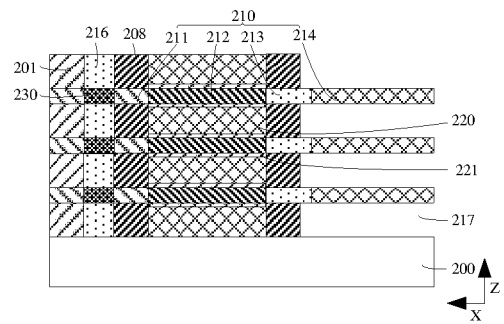
Figure 43:
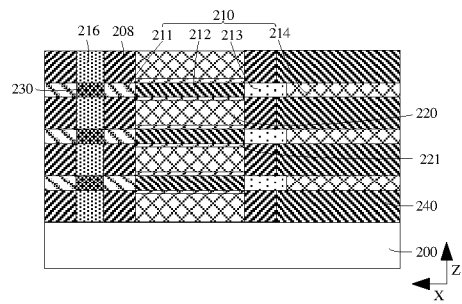
Figure 58:
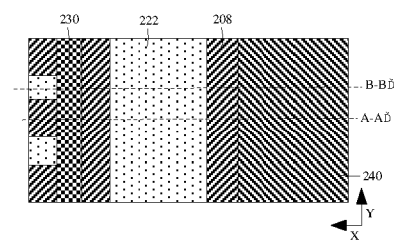

Referring to FIG. 43 and FIG. 58, the memory structure 240 is formed in the second region 217 (referring to FIG. 42).

The embodiments or implementations of this specification are described in a progressive manner, and each embodiment focuses on differences from other embodiments. The same or similar parts between the embodiments may refer to each other.

In the description of this specification, the description with reference to terms such as "an embodiment", "an exemplary embodiment", "some implementations", "a schematic implementation", and "an example" means that the specific feature, structure, material, or characteristic described in combination with the implementation(s) or example(s) is included in at least one implementation or example of the present disclosure.

In this specification, the schematic expression of the above terms does not necessarily refer to the same implementation or example. Moreover, the described specific feature, structure, material or characteristic may be combined in an appropriate manner in any one or more implementations or examples.

It should be noted that in the description of the present disclosure, the terms such as "center", "top", "bottom", "left", "right", "vertical", "horizontal", "inner" and "outer" indicate the orientation or position relationships based on the accompanying drawings. These terms are merely intended to facilitate description of the present disclosure and simplify the description, rather than to indicate or imply that the mentioned apparatus or element must have a specific orientation and must be constructed and operated in a specific orientation. Therefore, these terms should not be construed as a limitation to the present disclosure.

It can be understood that the terms such as "first" and "second" used in the present disclosure can be used to describe various structures, but these structures are not limited by these terms. Instead, these terms are merely intended to distinguish one structure from another.

The same elements in one or more accompanying drawings are denoted by similar reference numerals. For the sake of clarity, various parts in the accompanying drawings are not drawn to scale. In addition, some well-known parts may not be shown. For the sake of brevity, a structure obtained by implementing a plurality of steps may be shown in one figure. In order to understand the present disclosure more clearly, many specific details of the present disclosure, such as the structure, material, size, processing process, and technology of the device, are described below. However, as those skilled in the art can understand, the present disclosure may not be implemented according to these specific details.

Finally, it should be noted that the above embodiments are merely intended to explain the technical solutions of the present disclosure, rather than to limit the present disclosure. Although the present disclosure is described in detail with reference to the above embodiments, those skilled in the art should understand that they may still modify the technical solutions described in the above embodiments, or make equivalent substitutions of some or all of the technical features recorded therein, without deviating the essence of the corresponding technical solutions from the scope of the technical solutions of the embodiments of the present disclosure.

INDUSTRIAL APPLICABILITY

The embodiments of the present disclosure provide a semiconductor structure and a manufacturing method thereof. The semiconductor structure includes: a base, and bit lines, word lines, active pillars, and a memory structure that are located on the base. The bit line extends along a first direction. The word line extends along a second direction. The first direction is one of a direction perpendicular to a surface of the base or a direction parallel to the surface of the base, and the second direction is the other of the direction perpendicular to the surface of the base or the direction parallel to the surface of the base. The memory structure surrounds a support region of the active pillar, and the support region is located at an end of a source region or drain region, that is connected to the memory structure, of the active pillar. That is, the integration of 3D memory devices can be improved by 3D stacking of transistors and capacitors on the substrate, thereby improving the storage density of the semiconductor structure. The support region of the active pillar can be used as a support for the memory structure. The memory structure may be a one-transistor one-capacitor (1T-1C) structure. With a limited device cell area, the area occupied by the memory structure is maximized, which helps improve the storage density.

In addition, the word line surrounds the channel region of the active pillar, that is, the semiconductor structure is a GAA structure. In the GAA structure, the gate can surround the channel region of the semiconductor on all sides, which can desirably solve the problems such as leakage current, capacitance effect, and short channel effect due to reduced spacing between gates, and reduce the area occupied by the word line in the vertical direction, thereby helping improve the gate control performance and the integration of the semiconductor structure.

The invention claimed is:
1. A semiconductor structure, comprising:
  a base, and a plurality of bit lines, a plurality of word lines, a plurality of active pillars, and a plurality of capacitor structures that are located on the base;
  wherein the plurality of bit lines extends along a first direction, the plurality of word lines extends along a second direction, the first direction is perpendicular to a surface of the base, and the second direction is parallel to the surface of the base; and the plurality of active pillars are parallel to the base and arranged at intervals, each of the plurality of word lines surrounds a channel region of one of the plurality of active pillars, one of a source region or a drain region of each of the plurality of active pillars is electrically connected to one of the plurality of bit lines, the other of the source region or the drain region of each of the plurality of active pillars is electrically connected to one of the plurality of capacitor structures, each of the plurality of capacitor structures surrounds a support region of one of the plurality of active pillars, and the support region is located at one end of the source region or the drain region, that is connected to one of the plurality of capacitor structures, of each of the plurality of active pillars.

2. The semiconductor structure according to claim 1, wherein one of the plurality of word lines, the channel region, and the source region and the drain region that are located at two ends of the channel region constitute a transistor structure; and along a direction pointing from the source region to the drain region, at least two transistor structures are provided, and the at least two transistor structures are electrically connected to one of the plurality of bit lines.

3. The semiconductor structure according to claim 1, further comprising:
   an insulating layer, wherein the insulating layer is located between the plurality of word lines and the plurality of bit lines; and
   a medium layer, wherein the medium layer is located between the plurality of word lines and the insulating layer and between the plurality of word lines and the channel region.

4. The semiconductor structure according to claim 1, further comprising: an isolation layer, wherein the isolation layer is located between adjacent ones of the plurality of active pillars.

5. The semiconductor structure according to claim 1, wherein a material of the plurality of active pillars comprises an amorphous material.

6. The semiconductor structure according to claim 5, wherein the amorphous material comprises at least one of indium gallium zinc oxide, indium tin oxide, indium gallium zinc tin oxide, or indium tungsten oxide.

* * * * *